United States Patent
Tsao et al.

(10) Patent No.: US 6,552,267 B2
(45) Date of Patent: Apr. 22, 2003

(54) MICROELECTRONIC ASSEMBLY WITH STIFFENING MEMBER

(75) Inventors: Pei-Haw Tsao, Taichung (TW); Ken Chen, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/928,378

(22) Filed: Aug. 13, 2001

(65) Prior Publication Data

US 2003/0030968 A1 Feb. 13, 2003

(51) Int. Cl.$^7$ ............................................... H01L 23/00
(52) U.S. Cl. ...................... 174/52.4; 361/688; 361/690; 361/709; 257/675; 257/706
(58) Field of Search ................................. 174/52.4, 16.3; 361/688, 690, 709, 723, 813; 257/675, 706, 712, 738, 778

(56) References Cited

U.S. PATENT DOCUMENTS

| | | | | |
|---|---|---|---|---|
| 5,034,591 A | * | 7/1991 | Fang | 219/121.69 |
| 5,545,850 A | * | 8/1996 | Mahulikar et al. | 174/52.4 |
| 6,088,901 A | * | 7/2000 | Huber et al. | 29/469.5 |
| 6,225,695 B1 | * | 5/2001 | Chia et al. | 257/712 |
| 6,410,981 B2 | * | 6/2002 | Tao | 257/704 |

* cited by examiner

Primary Examiner—Chau N. Nguyen
Assistant Examiner—W. David Walkenhorst
(74) Attorney, Agent, or Firm—Tung & Associates

(57) ABSTRACT

A flip chip-ball grid array package and a stiffening ring having first and second faces, and grooves formed in at least a one of the first and second faces of the stiffening ring. Providing grooves in at least one of the faces of the stiffening ring imparts of degree of flexibility to the stiffening ring to overcome and accommodate stresses induced in the manufacturing process associated with adhesive curing, solder reflow, chip underfilling and cavity filling, and differences in the coefficient of thermal expansion of the various materials used to construct the assembly. Furthermore, forming grooves in at least one of the faces of the stiffening ring provides increased surface area and therefore improves the heat transfer property of the stiffening ring. At the same time, the stiffening ring provides a sufficient degree of rigidity to the first substrate and to the microelectronic assembly in general to facilitate handling of the microelectronic assembly without damaging the chip or its solder connections.

20 Claims, 2 Drawing Sheets

MICROELECTRONIC ASSEMBLY WITH STIFFENING MEMBER

FIELD OF THE INVENTION

This invention relates to microelectronic assemblies, and more particularly to a microelectronic assembly having a stiffening member.

BACKGROUND OF THE INVENTION

A flip chip microelectronic assembly includes a direct electrical connection of face down (that is, "flipped") electronic components onto substrates, such as ceramic substrates, circuit boards, or carriers using conductive bump bond pads of the chip. Flip chip technology is quickly replacing older wire bonding technology that uses face up chips with the wire connected to each pad on the chip.

The flip chip components used in flip chip microelectronic assemblies are predominantly semiconductor devices, however, components such as passive filters, detector arrays, and MEM devices are also being used in flip chip form. Flip chips are also known as "direct chip attach," because the chip is directly attached to the substrate, board, or carrier by the conductive bumps.

The use of flip chip packaging has dramatically grown as a result of the flip chips advantages in size, performance, flexibility, reliability, and cost over other packaging methods and from the widening availability of flip chip materials, equipment and services. In some cases, the elimination of old technology packages and bond wires may reduce the substrate or board area needed to secure the device by up to 25 percent, and may require far less height. Further, the weight of the flip chip can be less than 5 percent of the old technology package devices.

Flip chips are advantageous because of their high-speed electrical performance when compared to other assembly methods. Eliminating bond wires reduces the delay in inductance and capacitance of the connection, and substantially shortens the current path resulted in the high speed off-chip interconnection.

Flip chips also provide the greatest input/output connection flexibility. Wire bond connections are generally limited to the perimeter of the chip or die, driving the die sizes up as a number of connections have increased over the years. Flip chip connections can use the whole area of the die, accommodating many more connections on a smaller die. Further, flip chips can be stacked in 3-D geometries over other flip chips or other components.

Flip chips also provided the most rugged mechanical interconnection. Flip chips when underfilled with an adhesive such as an epoxy, can withstand the most rugged durability testing. In addition to providing the most rugged mechanical interconnection, flip chips can be the lowest cost interconnection for high-volume automated production.

The bumps of the flip chip assembly serve several functions. The bumps provided an electrical conductive path from the chip (or die) to the substrate on which the chip is mounted. A thermally conductive path is also provided by the bumps to carry heat from the chip to the substrate. The bumps also provided part of the mechanical mounting of the chip to the substrate. A spacer is provided by the bumps that prevents electrical contact between the chip and the substrate connectors. Finally, the bumps act as a short lead to relieve mechanical strain between the chip and the substrate.

Flip chips can be combined with a variety of packages. The ball grid array is one particular package which has gained significant popularity for use with the flip chip. The ball grid array package construction is significantly different from conventional leaded packages in several ways. Typically the ball grid array uses a resin based organic substrate onto which the flip chip die and solder balls are attached. The substrate incorporates metallized trace routing for connection from the die to a second substrate, such as a system board. The connection made to the second substrate is through solder balls on the underside of the first substrate. Ball grid array packages provided numerous advantages over conventional leaded packages such as: improved electrical performance due to shorter distances between the chip and the solder balls; improved thermal performance by use of thermal vias or heat dissipation through power and ground planes incorporated into the second substrate (e.g., main PC board); using less real estate on the underlying system board or second substrate; significantly reducing handling related lead damage due to use of solder balls instead of metal leads; and when the ball grid array is reflow attached to boards, the solder balls self aligned leading to higher manufacturing yields.

Despite all of these advantages, these microelectronic assemblies are very delicate structures, the design of which and manufacturing creates difficult and unique technical problems. Continuous efforts by those working in the art are being undertaken to improve the performance, reliability and useful life of microelectronic assemblies, particularly those using flip chips. The following is a description of some of the problems facing those skilled in the art.

Typically a flip chip will be mounted and electrically connected to a supporting substrate such as a ball grid array. The substrate may be secured to a printed circuit board. The flip chip can generate a considerable amount of heat during operation which may range from about 25 to 100 watts concentrated in the area the chip which usually ranges from 1 to 4 cubic centimeters. Those working in the art are constantly seeking ways to control and manage this concentrated heat generation to avoid failure of the microelectronic device due to overheating.

Failure to manage the heat generated by the flip chip may be very costly. The heat generated from the flip chip during operation may cause the chip dimensions to change and may result in damage to signals generated by the chip. Furthermore, thermal expansion may cause the chip to curve, bend or crack. These distortions in the chip may result in damage to the electrical connections between the chip and the substrate.

Furthermore, the substrate onto which the flip chip may be mounted can be a single layer structure, or the substrate may comprise two or many more layers of materials. Often these materials tend to be quite diverse in their composition and structure. The coefficient of thermal expansion for these different layers may be considerably different and may result in uncontrolled bending or thermal induced substrate surface distortions. Such distortions can cause failure of the flip chip or other components of the substrate.

In addition to chip warpage due to thermal effects, chip or substrate warpage may be caused by other steps of the manufacturing process. For example, chip warpage may occur as a consequence of the chip underfill process. Typically, adhesive underfill is applied between the opposing faces of the chip and the underlying substrate to secure the chip to the substrate and to secure the electrical connections, usually solder joints, between the chip and the substrate. When the adhesive underfill is cured or hardened, the cured adhesive tends to shrink placing the solder joints in a compressed state, and often the shrinking adhesive causes warpage of the substrate.

In an attempt to overcome these problems, those skilled in the art have used a constraining or stiffening ring that is typically mounted to the substrate with an adhesive. The stiffening ring forms a frame around the chip with the inner perimeter of the ring being spaced from the edges of the chip. Preferably the height of the stiffening ring is greater than that of the chip. The chip may be secured to the substrate either before or after the stiffening ring is secured to the substrate. FIG. 1 illustrates such a prior art assembly 10 using a typical stiffening ring 12. The stiffening ring 12 is typically a block like structure with flat upper and lower surfaces 14 and 16, and an aperture 18 through the middle thereof for receiving the flip chip 20. The stiffening ring 12 may be secured to an underlying substrate 24 using an adhesive layer 26. Solder bump joints 22 connect the flip chip die 20 to an underlying substrate 24. The underlying substrate 24 may be a ball grid array having solder balls 26 for connection of the ball grid array to a second substrate (not shown). A heat spreader (heat sink) 30 may be secured to the upper face 14 of the stiffening ring 12 using the adhesive layer 26. Likewise, an adhesive layer 26 may be used to secure the heat spreader 30 to the face of the flip chip die 20. Despite the use of these prior art stiffening rings 12, the chip 20 and its bump joints 22 that connects the chip 20 and underlying substrate 24 still experience undesirable stresses during the manufacture of the devices and during their operation. Furthermore, improved methods of dissipating heat from the chip area are needed.

The present invention overcomes many of the deficiencies of the prior art and provides alternatives thereto.

SUMMARY OF THE INVENTION

One embodiment of the invention includes a microelectronic assembly having a microelectronic element, a first substrate having a first face and an opposite second face, a stiffening member having a first face, a second face, an outer perimeter side and an inner perimeter side, and having a plurality of grooves formed in at least one of the first face and second face of the stiffening member. The microelectronic element is secured to the first face of the first substrate, and the stiffening member is secured to the first face of the first substrate so that the inner perimeter side is spaced a distance from the microelectronic element.

Providing grooves in one of the faces of the stiffening member imparts a degree of flexibility to the stiffening member to overcome and accommodate stresses induced in the manufacturing process associated with adhesive curing, solder reflow, chip underfilling and cavity filling, and differences in the coefficient of thermal expansion of the various materials used to construct the microelectronic assembly. Furthermore, forming grooves in at least one of the faces of the stiffening member provides increased surface area and therefore improves the heat transfer property of the stiffening member. At the same time, this stiffening member, according to the present invention, provides a sufficient degree of rigidity to the first substrate and to the microelectronic assembly in general to facilitate handling of the microelectronic assembly without damaging the microelectronic element or its solder connections.

In another embodiment of the invention, the microelectronic element includes an integrated circuit chip.

In another embodiment of the invention the microelectronic assembly includes solder balls secured to the second face of the first substrate.

In another embodiment of the invention the microelectronic assembly includes grooves formed in both the first face and the second face of the stiffening member.

In another embodiment of the invention the microelectronic assembly includes grooves formed in both the first face and second face of the stiffening member so that the stiffening member has a corrugated configuration In another embodiment of the invention the stiffening member includes a ring and wherein the inner perimeter side completely surrounds the microelectronic element.

In another embodiment of the invention the microelectronic element comprises a flip chip.

In another embodiment of the invention the first substrate includes a ball grid array.

In another embodiment of the invention the grooves are formed in the first face of the stiffening member, and the microelectronic assembly further includes an adhesive filling the grooves in the first face of the stiffening member and securing the stiffening member to the first face of the first substrate.

In another embodiment of the invention the grooves are formed in the second face of the stiffening member, and the microelectronic assembly further includes a heat sink secured to the stiffening member by adhesive that fills the grooves formed in the second face of the stiffening member.

In another embodiment of the invention the grooves are formed in both the first face and second face of the stiffening member, and the microelectronic assembly further includes a heat sink secured to the stiffening member by adhesive that fills the grooves formed in the second face of the stiffening member, and wherein the stiffening member is secured to the first substrate by an adhesive that fills the grooves formed in the first face of the stiffening member.

In another embodiment of the invention the microelectronic assembly further includes a second set of solder balls secured to the second face of the first substrate, and a second substrate secured to the second set of solder balls.

In another embodiment of the invention the stiffening member comprises copper.

In another embodiment of the invention nickel is plated over the copper.

In another embodiment of the invention the microelectronic assembly includes: a flip chip including an integrated circuit chip having a first face and an opposite second face, and solder balls connected to the first face; a support including a first substrate having a first face and an opposite second face; a stiffening member having a first face, a second face, an outer perimeter side and an inner perimeter side, and having a plurality of grooves formed in at least one of the first face and second face of the stiffening member; the flip chip is secured by the solder balls to the first face of the first substrate, and the stiffening member is secured to the first face of the first substrate so that the inner perimeter side is spaced a distance from the chip.

In another embodiment of the invention the support includes a ball grid array.

In another embodiment of the invention a plurality of grooves are formed in both of the first face and second face of the stiffening member.

Another embodiment of the invention includes a flip chip-ball grid array package having: a stiffening ring having a first face, a second face, an outer perimeter side and an inner perimeter side, and having a plurality of grooves formed in at least one of the first face and second face; the stiffening ring being secured to the ball grid array so that the inner perimeter side is spaced a distance from the flip chip.

These and other objects, features and advantages of the present invention will become apparent from the following brief description of the drawings, detailed description of the preferred embodiments, and the appended claims and drawings.

DETAILED DESCRIPTION

Figure 1:
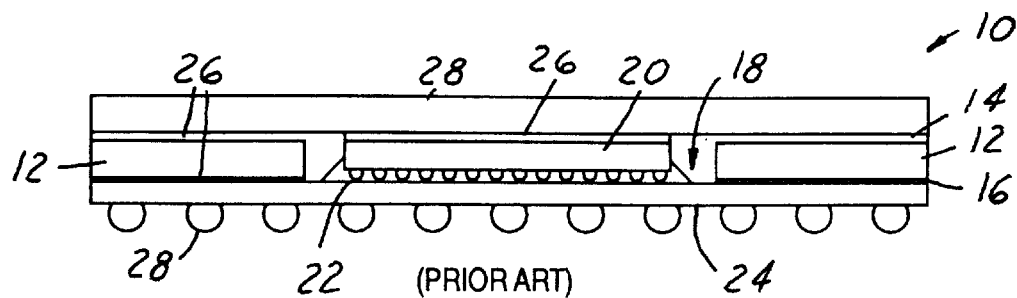
FIG. 1 is a side view of a prior art microelectronic assembly including a flip chip on a ball grid array and a flat stiffening ring surrounding the flip chip.
Figure 2:
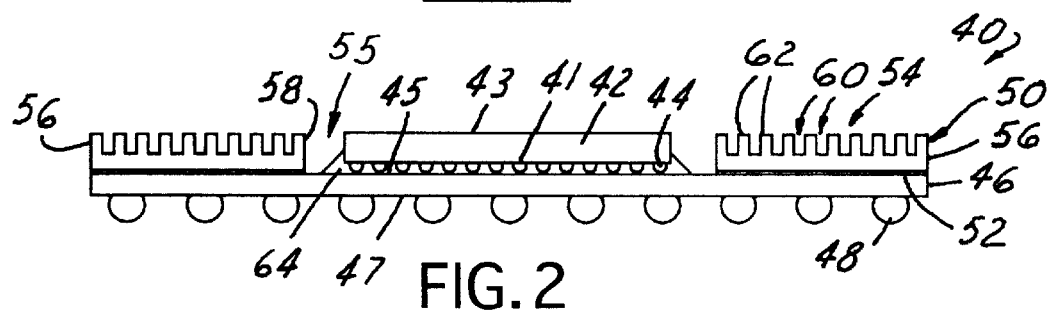
FIG. 2 is a side view of microelectronic assembly according to the present invention.

FIG. 2 is a side view of a microelectronic assembly 40 according to the present invention. The microelectronic assembly 40 includes a microelectronic element 42 which may be a semiconductor device such as an integrated circuit chip. The microelectronic element, hereafter referred to as chip 42, has first and second opposite faces 41 and 43. Solder balls 44 are connected to contact pads (not shown) on the first face 41. The combination of the chip 42 and the solder balls 44 are commonly known as and referred to as a flip chip, as also described above. The chip 42 is secured to a first substrate 46 underlying the chip. The solder balls 44 are attached to contact pads (not shown) on the first face 45 of the first substrate 46. A second set of solder balls 48 may be secured to contact pads (not shown) on the second face 47 of the first substrate 46. The combination of the first substrate 46 and the second set of solder balls 48 on the second face thereof are commonly known as and referred to as a ball grid array, as also described above.

A stiffening member or stiffening ring 50 is provided which preferably has generally rectangular or square shape with an aperture 55 formed therein to facilitate placement of the chip 42. This stiffening ring 50 has a first face 52, an opposite second face 54, and outer perimeter side 56 and an inner perimeter side 58 defined by the aperture 55. The stiffening ring 50 is secured to the first substrate 46 preferably with an adhesive 68 interposed between the flat first face 52 of the stiffening ring and the first face 45 of the first substrate 46. The adhesive 68 preferably is chosen to match or accommodate the coefficient of thermal expansion of the stiffening ring 50 and the first substrate 46. Although in the preferred embodiment, the stiffening member 50 has a ring like configuration, this stiffening member 50 may have a configuration that does not completely surrounding the chip 42. Preferably the stiffening ring 50 has a height that is the same as or slightly greater than the height of the flip chip. For example, for a flip chip having a height of 5 mm, the stiffening ring may have a height of 5–6 mm.

In one embodiment of the present invention, the second face 54 of the stiffening ring 50 has grooves 60 formed therein. The adjacent grooves 60 are separated from each other by a ridge or land 62. The grooves 60 may be formed by any means known to those skilled in the art or hereafter discovered including machining, etching, stamping, or may be cast or more molded to form the groove 60 and the land 62. Preferably the stiffening ring 50 comprises copper that is nickel plated, but may be of any material construction which provides the properties necessary to achieve the objectives of the present invention. Providing grooves in one of the faces 52 and/or 54 of the stiffening ring 50 imparts of degree of flexibility to the stiffening ring to overcome and accommodate stresses induced in the manufacturing process associated with adhesive curing, solder reflow, chip underfilling and cavity filling, and differences in the coefficient of thermal expansion of the various materials used to construct the microelectronic assembly. Furthermore, forming grooves in at least one of the faces 52 and/or 54 of the stiffening ring 50 provides increase surface area and therefore improves the heat transfer property of the stiffening ring 50. At the same time the stiffening ring 50, according to the present invention, provides a sufficient degree of rigidity to the first substrate 46 and to the microelectronic assembly 40 in general to facilitate handling of the microelectronic assembly without damaging the chip 42 or its solder connections 44.

Figure 3:
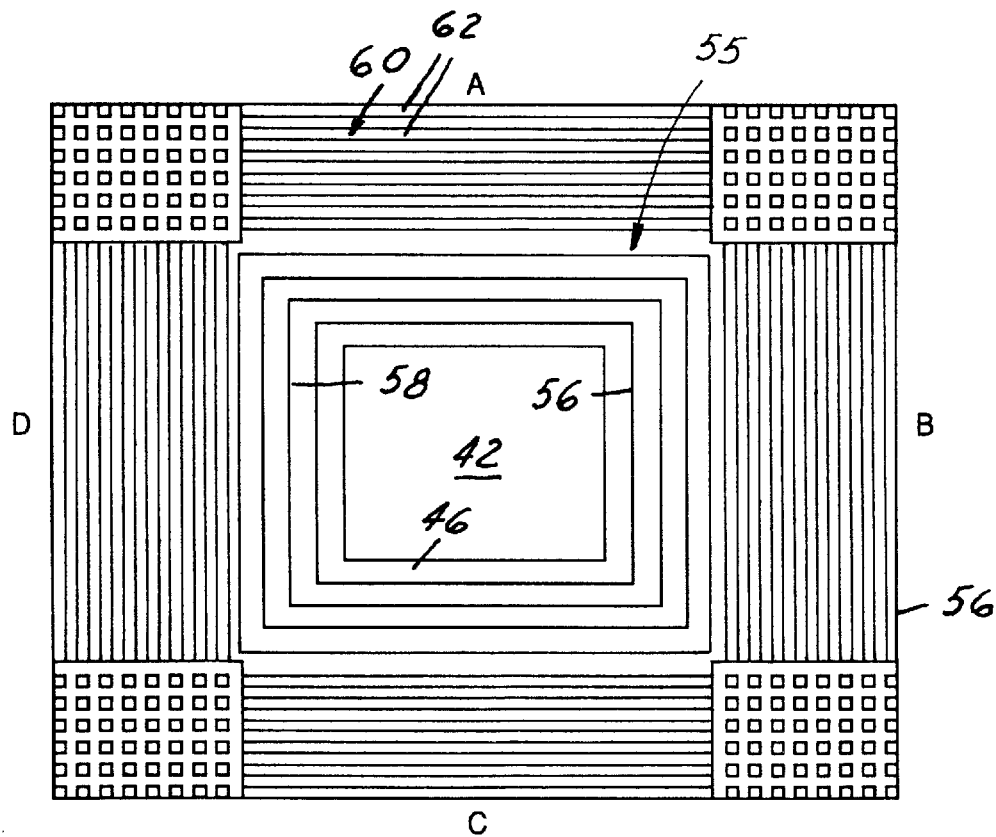
FIG. 3 is a plan view of the microelectronic assembly of FIG. 2.

FIG. 3 is a plan view of a microelectronic assembly 40 shown in FIG. 2. Preferably the stiffening member or stiffening ring 50 is secured to the underlying first substrate 46 so that the inner perimeter side 58 of the stiffening ring 50 is spaced a distance from the chip 42. The stiffening ring 50 has a rectangular or square configuration with four sections A, B, C and D each defined by portions of the outer and inner perimeters sides 56 and 58 that run parallel to each other. Preferably the grooves 60 in a section A, B, C, or D run generally parallel to each other.

Figure 4:
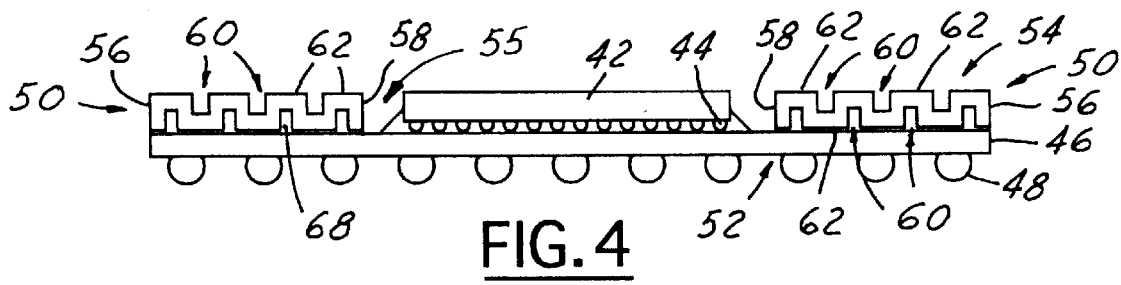
FIG. 4 is a side view of an alternative embodiment of a microelectronic assembly according to the present invention.

FIG. 4 illustrates an alternative embodiment of the present invention. In this embodiment, the microelectronic assembly includes a stiffening ring 50 that has a corrugated configuration wherein grooves 60 are formed in both the first face 52 and the second face 54. The corrugated stiffening ring 50 has grooves 60 in the first face 52 that are aligned with lands on the second face 54 and vice versa. Having grooves 60 formed in both faces 52 and 54 of this stiffening ring 50 provides even greater flexibility to accommodate stresses induced in the manufacturing process or during operation of the microelectronic assembly caused by differences in the coefficient of thermal expansion of the various components used to construct the assembly. Furthermore, grooves formed in both faces 52 and 54 of the stiffening ring 50 provide even greater surface area giving the stiffening ring 50 improved heat transfer properties. A sufficient amount of adhesive 68 may be used to fill the grooves 60 on the first face 52 of the stiffening member 50 when the stiffening member is secured to the first substrate 46. Filling the grooves 60 with an adhesive 68 results in a better match of the coefficient of thermal expansion of the first substrate 46 and the stiffening ring 50. The same results can be accomplished if the grooves 60 formed in the second face 54 of the stiffening ring 50 are filled with an adhesive 68 and a heat spreader is secured to the top of the stiffening ring 50.

Figure 5:
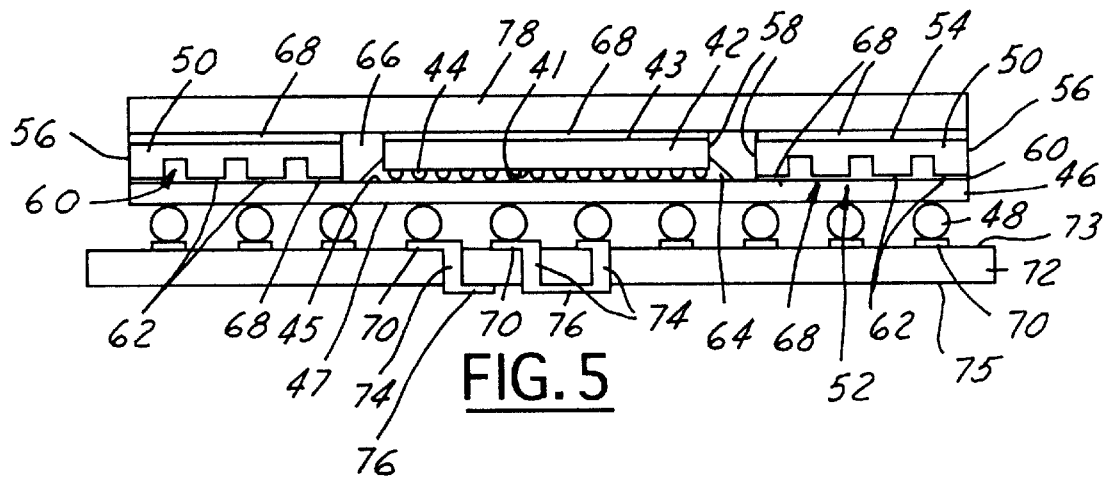
FIG. 5 is a side of an alternative embodiment of a microelectronic assembly according to the present invention.

FIG. 5 illustrates another embodiment of a microelectronic assembly according to the present invention. In this embodiment, grooves 60 are formed and the first face 52 of the stiffening ring 50. Sufficient adhesive 68 is applied to the first face 52 of the stiffening ring 50 to fill the grooves 60 and to secure the stiffening ring 52 to the first face 45 of the first substrate 46. An underfill 64 may be provided to fill the gap between the first face 41 of the chip and the first face 45 of the first substrate 46. Adhesive 68 may be also be applied to the flat second face 54 of the stiffening ring 50 to secure the stiffening ring 50 to a heat spreader 78. Likewise adhesive 68 may be applied to the second face 43 of the chip. In addition to the adhesive applied to the second face 43 of the chip 42, or as an alternative thereto, the cavity surrounding the chip 42 may be filled, in a manner known to those skilled, with a suitable material 66 such as an encapsulation gel or other material with desired properties. By way of example, an opening may be provided in the heat spreader 78 through which a needle may be inserted and the cavity surrounding the chip 42 may be filled with the suitable material 66.

Solder balls 48 are connected to the second face (underside) 47 of the first substrate 46 may be secured to contact pads 70 on a second substrate 72. The contact pads 70 may be the termination of electrical traces (not shown) or may connect to a thermal via 74 that extends through the second substrate 72 and is connected to thermal pads 76 on a second face 75 of the second substrate 76. The second substrate 72 may be a printed wire board (also sometimes called a printed circuit board), or may be a multilayer module known to those skilled in the art.

What is claimed is:

1. A microelectronic assembly comprising:

a microelectronic element;

a first substrate having a first face and an opposite second face;

a stiffening member having a first face, a second face, an outer perimeter side and an inner perimeter side, and having a plurality of grooves formed in at least one of the first face and second face of the stiffening member, said grooves being formed therein so that the stiffening member has a degree os flexibility sufficient to overcome and accommodate stresses induced in the manufacturing process of the microelectronic assembly; and the microelectronic element being secured to the first face of the first substrate, and the stiffening member being secured to the first face of the first substrate so that the inner perimeter side is spaced a distance from the microelectronic element.

2. A microelectronic assembly as set forth in claim 1 wherein the microelectronic element comprises an integrated circuit chip.

3. A microelectronic assembly as set forth in claim 1 further comprising solder balls secured to the second face of the first substrate.

4. A microelectronic assembly as set forth in claim 1 wherein grooves are formed in both the first face and the second face of the stiffening member.

5. A microelectronic assembly as set forth in claim 4 wherein the grooves are formed in both the first face and second face of the stiffening member so that the stiffening member has a corrugated configuration.

6. A microelectronic assembly as set forth in claim 1 wherein the stiffening member comprises a ring and wherein the inner perimeter side completely surrounds the microelectronic element.

7. A microelectronic assembly as set forth in claim 1 wherein the microelectronic element comprises a flip chip.

8. A microelectronic assembly as set forth in claim 1 wherein the first substrate comprises a ball grid array.

9. A microelectronic assembly as set forth in claim 1 wherein the grooves are formed in the first face of the stiffening member, and further comprising an adhesive filling the grooves in the first face of the stiffening member and securing the stiffening member to the first face of the substrate.

10. A microelectronic assembly as set forth in claim 1 wherein the grooves are formed in the second face of the stiffening member, and further comprising a heat sink secured to the stiffening member by adhesive that fills the grooves formed in the second face of the stiffening member.

11. A microelectronic assembly as set forth in claim 1 wherein grooves are formed in both the first face and second face of the stiffening member, and further comprising a heat sink secured to the stiffening member by adhesive that fills the grooves formed in the second face of the stiffening member, and secured to the first substrate by an adhesive that fills the grooves formed in the first face of the stiffening member.

12. A microelectronic assembly as set forth in claim 1 further comprising a second set of solder balls secured to the second face of the first substrate, and a second substrate secured to the second set of solder balls.

13. A microelectronic assembly as set forth in claim 1 wherein the stiffening member comprises copper.

14. A microelectronic assembly as set forth in claim 13 further comprising nickel plated over the copper.

15. A microelectronic assembly comprising:

a flip chip comprising an integrated circuit chip having a first face and an opposite second face, and a first set of solder balls connected to the first face;

a support comprising a first substrate having a first face and an opposite second face;

a stiffening member having a first face, a second face, and at least a first segment including an outer perimeter side and an inner perimeter side, and having a plurality of grooves formed in at least one of the first face and second face of the stiffening member, at least one groove running parallel to the inner perimeter side of the first segment; and the flip chip being secured by the first set of solder balls to the first face of the first substrate, and the stiffening member being secured to the first face of the first substrate so that the inner perimeter side is spaced a distance from the chip.

16. A microelectronic assembly as set forth in claim 15 wherein the support comprises a ball grid array.

17. A microelectronic assembly as set forth in claim 15 wherein a plurality of grooves formed in both of the first face and second face of the stiffening member.

18. A microelectronic assembly as set forth in claim 15 wherein the stiffening member comprises copper.

19. A flip chip-ball grid array package comprising:

a stiffening ring having a first face, a second face, and a plurality of segments with each segment having an outer perimeter side and an inner perimeter side, and having a plurality of grooves formed in at least one of the first face and second face of the stiffening ring, the plurality of segments including a first segment and at least one of the grooves is formed in the first segment running parallel to the inner perimeter side of the first segment; and the stiffening ring being secured to a flip chip-ball grid array assembly so that the inner perimeter side is spaced a distance from the flip chip.

20. A microelectronic assembly as set forth in claim 19 wherein a plurality of grooves formed in both of the first face and second face of the stiffening ring.

* * * * *